United States Patent

Denissen et al.

[11] Patent Number: 5,854,810
[45] Date of Patent: Dec. 29, 1998

[54] APPARATUS AND METHODS FOR USE IN TRANSMITTING AND RELIEVING A DIGITAL SIGNAL AND A RECORD CARRIER OBTAINED BY A TRANSMITTED APPARATUS OR METHOD

[75] Inventors: Adrianus J. M. Denissen; Ludovicus M. G. M. Tolhuizen, both of Eindhoven, Netherlands

[73] Assignee: U.S. Phillips Corporation, New York, N.Y.

[21] Appl. No.: 709,404

[22] Filed: Sep. 4, 1996

[30] Foreign Application Priority Data

Sep. 8, 1995 [EP] European Pat. Off. .............. 95202443

[51] Int. Cl.⁶ ........................... H04B 14/04; H03M 13/00
[52] U.S. Cl. ...................... 375/242; 375/242; 371/37.07; 371/37.5; 341/58
[58] Field of Search .................................. 371/37.4, 37.5, 371/37.11, 37.7, 38.1, 39.1, 37.07, 37.12, 40.14, 40.3; 235/494, 487; 395/893; 341/58, 94; 375/242

[56] References Cited

U.S. PATENT DOCUMENTS

| | | | |
|---|---|---|---|
| 4,531,153 | 7/1985 | Watanabe | 358/141 |
| 5,469,448 | 11/1995 | Denissen et al. | 371/353 |
| 5,477,222 | 12/1995 | Kahlman et al. | 341/95 |
| 5,671,236 | 9/1997 | Denissen et al. | 371/37.1 |

*Primary Examiner*—Stephen Chin
*Assistant Examiner*—Shuwang Liu

*Attorney, Agent, or Firm*—Edward W. Goodman

[57] ABSTRACT

A transmitter apparatus for transmitting a digital data signal via a transmission medium (10) includes an error protection encoder (3) for carrying out an error protection encoding on the digital data signal so as to obtain an error protection encoded digital data signal, and a channel encoder (6) for converting the error protection encoded digital data signal processed into a channel encoded digital data signal. The channel encoded digital data signal is supplied to the transmission medium. The error protection encoder (3) is adapted to carry out an error protection encoding step on packets of p m-bit digital words in the digital data signal, and for supplying error protection encoded packets (Q) of n m-bit digital words to an output, where n, m and p are integers larger than 1, and n>p. The channel encoder (6) is adapted to convert the error protection encoded packets of n digital words into converted packets (CP, CP') of digital words to form the channel encoded digital data signal and has a generator (60) for supplying at least fixed auxiliary packet $(Q_{f.1}, Q_{f.2})$ also having the length of n digital words. The channel encoder further includes a calculator (58, 66) for calculating, in a Galois field $GF(2^m)$, a converted digital word $CW_i$ in accordance with the formula $DW_i + \alpha_1 \cdot FW_{1,i} + \alpha_2 \cdot FW_{2,i} + \ldots$, where $DW_i$ is the binary value corresponding to the i-th digital word in the packet (Q), $FW_{1,i}$ and $FW_{2,i}$ being the fixed binary values corresponding to the i-th digital word in the first and second fixed auxiliary packet $(Q_{f.1}, Q_{f.2})$, respectively, and $CW_i$ is the binary value of the i-th converted digital word in the converted packet (CP, CP') of digital words, where i is an integer value running from 1 to n.

19 Claims, 4 Drawing Sheets

APPARATUS AND METHODS FOR USE IN TRANSMITTING AND RELIEVING A DIGITAL SIGNAL AND A RECORD CARRIER OBTAINED BY A TRANSMITTED APPARATUS OR METHOD

BACKGROUND OF THE INVENTION

1. Field of The Invention

The invention relates to a transmitter apparatus, for transmitting a digital data signal via a transmission medium. The invention also relates to a method for transmitting and a method for receiving a channel encoded signal generated by the transmitter. The invention further relates to a record carrier obtained by the method, in the case that the method for transmitting is in the form of a method for recording the channel encoded signal on a record carrier. The record carrier can be a magnetic record carrier or an optical record carrier. The data signal supplied to the transmitter apparatus can, as an example, be a data compressed digital video signal.

2. Description of The Related Art

A transmitter apparatus defined above, which is in the form of a recording apparatus for recording the digital data signal on a record carrier, such as a magnetic record carrier, is known from European Patent Application EP-A 492,704, corresponding to U.S. Pat. No. 5,245,483.

Embodiments of channel encoding means are disclosed in U.S. Pat. No. 5,136,436, and European Patent Applications EP-A 476,766 and EP-A 476,767, corresponding to U.S. Pat. Nos. 5,140,474 and 5,142,421, respectively. Further, reference is made to the publication "DC-Free Coset Codes" by R. H. Deng et al., in IEEE Trans. on IT, Vol. 34, No. 4, July 1988, pp. 786–792, which also discloses a channel encoding for magnetic and optical recording.

SUMMARY OF THE INVENTION

The invention aims at providing an improved way of realizing a channel encoding. To that purpose, the transmitter apparatus is characterized in that the error protection encoding means is adapted to carry out an error protection encoding step on packets of p m-bit digital words in the digital data signal, and for supplying error protection encoded packets of n m-bit digital words to an output, where n, m and p are integers larger than 1, and n>p, the channel encoding means being adapted to convert the error protection encoded packets of n digital words into converted packets of digital words to form the channel encoded digital data signal, the channel encoding means comprising generator means for supplying at least two fixed auxiliary packets also having the length of n digital words each, the channel encoding means further comprising calculation means for calculating, in a Galois field $GF(2^m)$, a converted digital word $CW_i$ in accordance with the formula $DW_i + \alpha_1 \cdot FW_{1,i} + \alpha_2 \cdot FW_{2,i} + \ldots$, where $DW_i$ is the i-th digital word in the packet, $FW_{1,i}$, $FW_{2,i}$, ... being the i-th digital word in the at least two fixed auxiliary packets, and $CW_i$ is the i-th converted digital word in the converted packet of digital words, where i is an integer value running from 1 to n.

Preferably, the at least two auxiliary packets comprise a number of digital words of non-zero binary value, the positions of the non-zero digital words in an auxiliary packet not coinciding with any one of the positions of the non-zero digital words in any other auxiliary packet, the remaining digital words in an auxiliary packet having a zero binary value.

The transmitter is preferably further characterized in that the channel encoding means further comprises digital sum value determining means for determining a digital sum value of at least a converted packet in the serial datastream of the sequence of converted packets of digital words that form the channel encoded digital data signal, the calculation means being further adapted to determine values $\alpha_{1,def}, \alpha_{2,def} \ldots$ for each packet of digital words, the channel encoding means being further adapted to convert a packet of digital words into a converted packet of digital words in accordance with the formula $DW_i + \alpha_{1,def} \cdot FW_{1,i} + \alpha_{2,def} \cdot FW_{2,i} + \ldots$, the values $\alpha_{1,def}, \alpha_{2,def} \ldots$ being such that a running digital sum value of the serial datastream of the converted packets shows a desired pattern as a function of time.

The invention is based on the recognition that the known channel encoding algorithms do not always have a very high efficiency. For instance, in U.S. Pat. No. 5,136,436, a discussion can be found concerning the efficiency of various channel encoding algorithms. As an example, a 8-to-10 conversion results in an efficiency of 80%, whereas a 9-to-10 conversion results in an efficiency of 90%. An improvement of efficiency was obtained with the 24-to-25 conversion algorithm of U.S. Pat. No. 5,142,421. The efficiency has increased to a value between 96% and 97%.

With the present invention, however, even higher efficiencies are possible. Suppose that m equals 8. That is, 256 possible values for $\alpha$ exist. The number of digital words in the converted packet must thus be lower than 256. However, the number of words in a converted packet generated by the channel encoding means is dependent on the number of constraints that should be satisfied by each of the converted packets in the channel encoded signal. Or, if the number of constraints is high(er), the number of words in the packet will be low(er).

One constraint, well known from the prior art, is the requirement that the resulting channel encoded signal is DC free. Another requirement is the embedding of one or more pilot signals in the digital datastream of the channel encoded signal, so as to enable tracking during reproduction. Again, other constraints are a specific maximum runlength $T_{max}$ for the channel encoded signal. Further, where the converted packet includes a sync word, it is sometimes (but not always) required that the bit pattern of the sync word is not present elsewhere in the converted packet. All of these requirements result in values for $\alpha$ that are not acceptable.

Investigations have led to a realization of a channel encoder in accordance with the invention where the packet comprises in the order of 200 digital words, and where still one or more values for $\alpha_1, \alpha_2, \ldots$ have remained as acceptable values. Consequently, the efficiency of this channel encoder has increased to a value of about 99.5%.

Further, by carrying out the algorithm as claimed, this provides an error protection on the values $\alpha_{1,def}, \alpha_{2,def} \ldots$ transmitted, so that the values for $\alpha_{1,def}, \alpha_{2,def} \ldots$ are less vulnerable to errors occurring during the transmission and reception (recording and reproduction) steps.

It will be apparent that such increase in efficiency can only be obtained by a more complex encoding in the channel encoding means. The channel decoding means can, however, be very simple.

A receiver apparatus in accordance with the invention carries out a signal processing on the transmitted signal so as to regenerate a replica of the original digital data signal.

The receiver apparatus for receiving a digital data signal that has been transmitted as a serial datastream of converted packets via the transmission medium by means of the transmitter apparatus as described above, comprises:

receiving means for receiving a transmission signal from the transmission medium so as to obtain a replica of the serial datastream of converted packets at an output;

channel decoding means for converting a channel encoded signal into a channel decoded signal; and error correction decoding means for carrying out an error detection and correction on the signal applied to its input, is characterized in that the input of the error correction decoding means is coupled to the output of the reproducing means, an output of the error correction decoding means is coupled to an input of the channel decoding means, the digital data signal being available at an output of the channel decoding means, that the channel decoding means are adapted to reconvert packets of digital words, each packet comprising a value for $\alpha$ and n m-bit converted digital words, where n and m are integers larger than 1, wherein the channel decoding means comprises:

retrieval means for retrieving the values $\alpha_1, \alpha_2, \ldots$, one set of $\alpha_1, \alpha_2, \ldots$ for each of the packets, from the information applied to the input of the channel decoding means;

generator means for supplying at least two fixed auxiliary packets also having the length of n digital words; and calculation means for calculating, in a Galois field $GF(2^m)$, reconverted words $RDW_i$ in accordance with the formula $CW_i - \alpha_1 \cdot FW_{1,i} - \alpha_2 \cdot FW_{2,i} - \ldots$, where $CW_i$ is the i-th converted digital word in the converted packet, $FW_{1,i}, FW_{2,i}, \ldots$ being the i-th digital words in the at least two fixed auxiliary packets, and $RDW_i$ is the i-th reconverted digital word in the reconverted packet of reconverted digital words, where i is an integer value running from 1 to n.

A specific feature of the receiver apparatus is that the channel decoding means, which is normally positioned before the error correction decoding means, is now preceded by the error correction decoding means. As a result of the algorithm in the channel encoding means in the transmitter apparatus carried out on the packets of n digital words, the adding of the $\alpha$ values so as to obtain the converted packet is a linear process, so that carrying out the error correction decoding on the complete converted packet means that also a correction on the $\alpha$ values is carried out.

It should be noted that, where, as indicated above, the channel encoding realizes a running digital sum such that it shows a desired pattern as a function of time, the invention equally well lies in carrying out the channel encoding for realizing solely (or in combination with another requirement) the requirement for the maximum runlength in the channel encoded signal, or for realizing solely (or in combination with another requirement) the requirement that only a certain maximum number of "01" combinations may occur directly after each other in the serial datastream of the channel encoded signal.

BRIEF DESCRIPTION OF THE DRAWINGS

These and other aspects of the invention will be further elucidated with reference to the embodiments given in the description, in which.

DESCRIPTION OF THE PREFERRED EMBODIMENTS

Figure 1A:
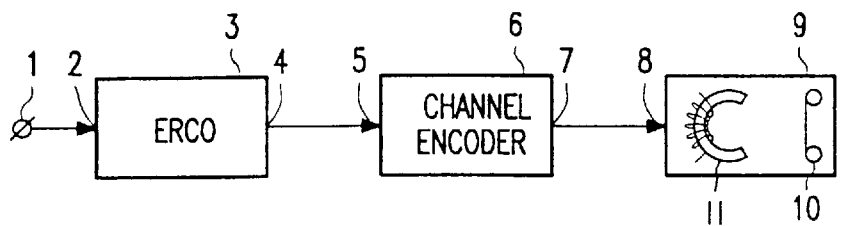
FIG. 1A shows an embodiment of the transmitter apparatus, which is in the form of a recording apparatus, and FIG. 1B an embodiment of the receiver apparatus, which is in the form of a reproducing apparatus.

FIG. 1A shows, schematically and in block diagram, an embodiment of the transmitter apparatus, which is in the form of a recording apparatus for recording the digital data signal on a magnetic record carrier. The recording apparatus has an input terminal 1 which is coupled to an input 2 of an error correction encoding unit (ERCO) 3, an output 4 of which is coupled to an input 5 of a channel encoder unit 6. An output 7 of the channel encoder unit 6 is coupled to an input 8 of a recording unit 9, which is adapted to record the output signal of the encoder unit 6 on a magnetic record carrier 10, by means of at least one write head 11.

Figure 1B:
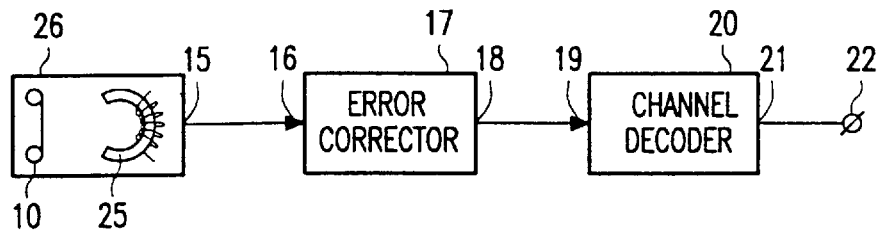

FIG. 1B shows, schematically and in block diagram, an embodiment of the receiver apparatus, which is in the form of a reproduction apparatus for reproducing the signal recorded by the apparatus of FIG. 1A on the record carrier 10, from that record carrier. The reproducing apparatus comprises a reproducing unit 26 which is adapted to read information from a track on the record carrier 10 by means of a read head 25. An output 15 of the reproducing unit 26 is coupled to an input 16 of an error corrector 17. An output 18 of the error corrector 17 is coupled to an input 19 of a channel decoding unit 20, an output 21 of which is coupled to the output terminal 22 of the reproducing apparatus.

Special attention should be paid to the sequence in which the units are serially arranged in the recording apparatus of FIG. 1A and the reproducing apparatus of FIG. 1B. The recording apparatus of FIG. 1A has the error correction encoding unit 3 and the channel encoding unit 6 in their normal order. It is expected that, in order to carry out the inverse signal processing in the reproducing apparatus, the channel decoder unit 20 should be followed by the error correction decoding unit 17. FIG. 1B however shows that this order is reversed. Because of the specific signal processing carried out in the channel encoder unit 6, as will be explained later, it has become possible to exchange the order of the serial arrangement of the channel decoder unit 20 and the error correction unit 17, so that an error correction step can be realized on the $\alpha_{def}$ values to be explained later, resulting in a better protection of the $\alpha_{def}$ values transmitted.

Figure 2A:
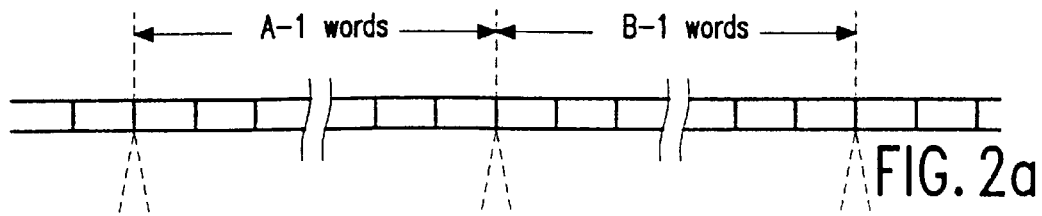
FIGS. 2a–2h show various datastreams for explaining the signal processing carried out.
Figure 2B:
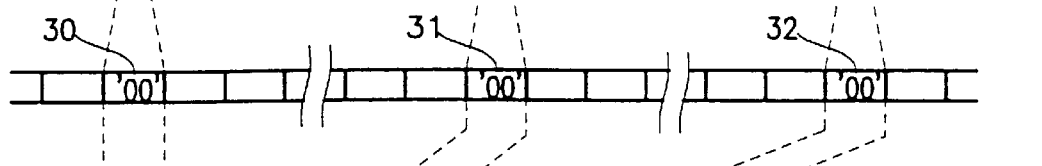
Figure 2C:
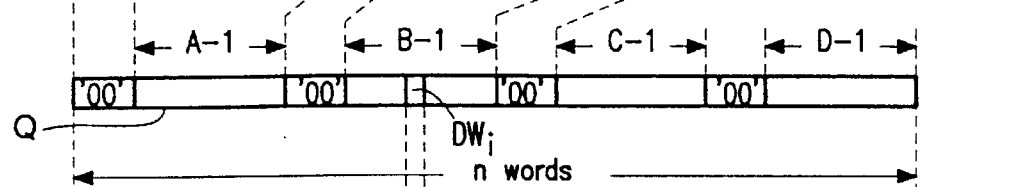

In the error correction encoder 3, an error correction encoding is carried out on, each time, a packet of p digital words (bytes), of 8 bits each. FIG. 2b shows the serial datastream of the 8-bit words applied to the input terminal 1. As a result of the error correction encoding, n-p parity bytes are added to the packet of bytes, so as to obtain subsequent packets Q of n digital words (bytes) of 8 bits each. This is shown in FIG. 2c. The signal of FIG. 2b has been obtained from a signal shown in FIG. 2a, in which, at various locations, an 8-bit word having a zero value has been inserted. As can be seen in FIGS. 2a and 2b, a zero value word 30, that is "00" (hex), has been inserted and another zero value word 31 has been inserted A−1 words later. A further zero value word 32 has been inserted again B−1 words later in the serial datastream of FIG. 2a. A sequence of p words, starting with the word 30, is used in the error correction encoding step so as to obtain the packet of n words shown in FIG. 2c. The n-p parity words may be the last n-p words in the packet shown in FIG. 2c, or may be dispersed inside the packet, as long as their positions in the packet are known.

The packets Q, generated by the encoder 3, are supplied to the channel encoder unit 6. The channel encoder 6 is needed so as to convert the serial datastream of digital words supplied by the encoder 3 into a converted datastream that can be supplied to the transmission channel, and is adapted to the characteristics of the transmission channel: that is, in the present case, the magnetic recording channel.

The characteristics of the transmission channel pose constraints on the signal that is applied to the input 8 of the recording unit 9.

One requirement is that the serial datastream applied to the recording unit 9 should be DC free. This can generally be realized by channel encoding "blocks of data" into converted blocks of data that have a disparity of zero. The disparity is defined as the digital sum value (or DSV) over the whole "block of data" in question. These "blocks of data" will be the converted packets to be described later.

Another requirement is to embed, in the serial datastream, a pilot signal of relatively low frequency compared to the frequencies normally present in the serial datastream, so as to enable tracking during reproduction. This can be realized by computing the running digital sum value (or DSV) of the channel encoded signal and to channel encode "blocks of data" into converted blocks of data so that the running digital sum value behaves as the said pilot signal.

A further requirement is that the channel encoded signal should satisfy a certain minimum and maximum runlength $T_{min}$ and $T_{max}$, respectively. The requirement of $T_{min}$ means that the minimum number of successive "zeros" or "ones" that is allowed in the serial datastream of the channel encoded signal is $T_{min}$, and the requirement of $T_{max}$ means that the maximum number of successive "zeros" or "ones" that is allowed in the serial datastream of the channel encoded signal is $T_{max}$.

Again, another requirement has a relation to the sync words that are regularly inserted in the serial datastream so as to obtain the channel encoded signal for the recording unit 9. Sometimes it is required that, apart from the sync word in the channel encoded signal, the serial datastream of the channel encoded signal does not include bit patterns that are the same as the bit pattern of the sync word.

Channel encoding carried out in the channel encoder unit 6 results in a computation to be carried out on the packets of n digital words, denoted $DW_1$ to $DW_n$, as will be explained as follows.

Figure 2D:
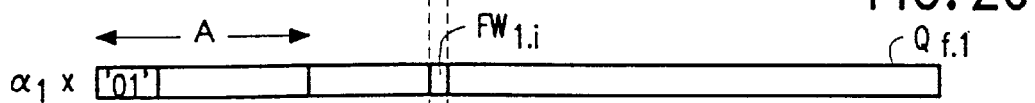
Figure 2E:
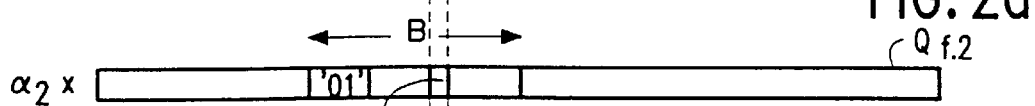
Figure 2F:
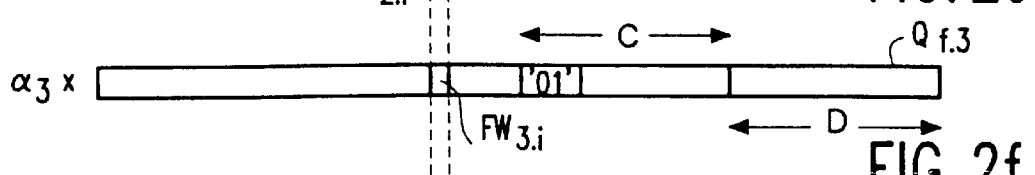
Figure 2G:
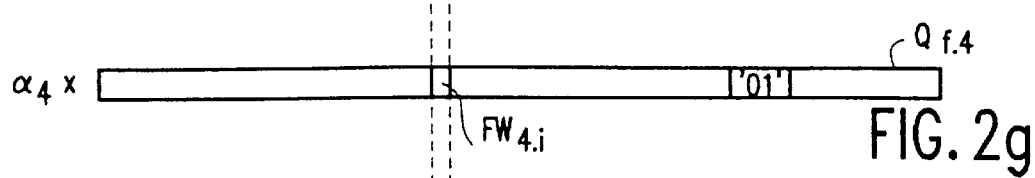

Fixed packets $Q_{f,1}, Q_{f,2}, \ldots$, in the present example, four fixed packets $Q_{f,1}$ to $Q_{f,4}$, are available in the channel encoder 6. The fixed packets have the following form. The fixed packet $Q_{f,1}$, see FIG. 2d, has its first A words with non-zero values. The other n-A words have zero values. The fixed packet $Q_{f,2}$, see FIG. 2e, has its first A words with zero values. The next B words have non-zero values. The remaining n-A-B words have zero values. The fixed packet $Q_{f,3}$, see FIG. 2f, has its first A+B words with zero values. The next C words have non-zero values. The remaining n-A-B-C words have zero values. The fixed packet $Q_{f,4}$, see FIG. 2g, has its first n-D words with zero values. The last D words have non-zero values.

A, B, C and D may be equal to each other. The position of a non-zero word in one of the fixed packets does not coincide with the position of any other non-zero word in any one of the fixed packets.

The first words of the non-zero portions of the fixed packets $Q_{f,1}$ to $Q_{f,4}$ have a value "01" (hex), that is a (decimal) value of one. Further, the fixed packet $Q_{f,1}$ has been obtained by selecting A-(n-p) of the non-zero words (which includes the first non-zero word) more or less arbitrarily. Next, the remaining n-p of the A non-zero words of the fixed packet $Q_{f,1}$ words are obtained by carrying out the same error correction encoding as explained above on the A-(n-p) non-zero words selected. In the same way, the fixed words $Q_{f,2}$ to $Q_{f,4}$ can be obtained.

With the fixed packets $Q_{f,1}$ to $Q_{f,4}$ so obtained, corresponding words $DW_i$ and $FW_{1,i}$ to $FW_{4,i}$ of the packets Q and $Q_{f,1}$ to $Q_{f,4}$, respectively, are added in conformity with the following formula, so as to obtain converted digital words $CW_i$:

$$DW_i + \alpha_1 \cdot FW_{1,i} + \alpha_2 \cdot FW_{2,i} + \alpha_3 \cdot FW_{3,i} + \alpha_4 \cdot FW_{4,i} = CW_i,$$

where $\alpha_1$ to $\alpha_4$ shall have to be determined in accordance with requirements to be discussed later. Calculations are carried out in the Galois field $GF(2^m)$, where m=8 in the present case. Otherwise said, calculations are carried out on $DW_i$ and $FW_{1,i}$ to $FW_{4,i}$, where the values for $DW_i$ and $FW_{1,i}$ to $FW_{4,i}$ are elements of a closed set of values, and where the resulting values $CW_i$ of the calculation are elements from the same closed set of values. As a result, the words $CW_i$ are again 8-bit digital words, just as the words $DW_i$ and $FW_{1,i}$ to $FW_{4,i}$ (in the present example). Reference is made in this respect to the book "Introduction To The 4:2:2 Digital Video Tape Recorder" by Stephen Gregory, Pentech Press London, 1988, more specifically, the Appendix A in that book on p. 172 to 189.

Figure 2H:
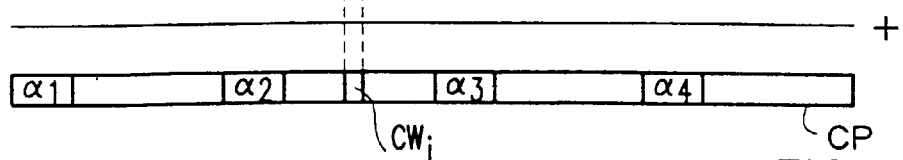

The algorithm is carried out in the channel encoder unit 6 for certain values for $\alpha_1$ to $\alpha_4$ so as to obtain a converted packet CP, as shown in FIG. 2h.

Suppose, for the moment, that the channel encoding should result in a DC free output signal of the encoder 6. Now, the disparity of the converted packet obtained for a certain value for each of the $\alpha_1$ to $\alpha_4$ is calculated by adding all "ones" in the converted packet, and subtracting a value of one for each of the "zeros" in the converted packet. If the disparity thus calculated equals zero, the values for $\alpha_1$ to $\alpha_4$ are accepted as acceptable values $\alpha$ for obtaining the converted packet. If the disparity thus calculated is unequal to zero, the set of four values for $\alpha_1$ to $\alpha_4$ is considered inadmissible. Another value for one or more of the $\alpha_1$ to $\alpha_4$ is now chosen and, again, it is determined whether the disparity of the converted packet obtained with the other values for $\alpha_1$ to $\alpha_4$ is zero. If so, this other set of four values for $\alpha_1$ to $\alpha_4$ is accepted. If not, the previous procedure is repeated until an acceptable set of four values for each of the $\alpha_1$ to $\alpha_4$ has been found.

Figure 3:
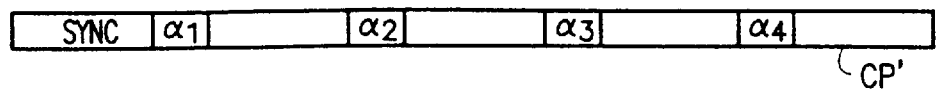
FIG. 3 shows the serial datastream of the output signal of the channel encoding unit in the recording apparatus.

If the channel encoding unit 6 is also capable of adding a sync word to the packet CP, the channel encoding unit 6 generates converted packets CP', as shown in FIG. 3, at its output 7. In this situation, the disparity of the converted packet CP', including the sync word, is calculated so as to determine whether a set of four values for $\alpha_1$ to $\alpha_4$ is acceptable.

If further constraints should be satisfied, such as the requirement that the channel encoded signal should satisfy a certain $T_{min}$, the converted packet CP (or CP') is checked for the smallest sequence of "ones" or "zeros" in the packet. If the number of consecutive "ones" or "zeros" in said sequence is larger than or equal to $T_{min}$, the set of four values for $\alpha_1$ to $\alpha_4$ is accepted. If not, the set of four values is rejected. In the same way, if the channel encoded signal should satisfy a certain $T_{max}$, the converted packet CP (or CP') is checked for the longest sequence of "ones" or "zeros" in the packet. If the number of consecutive "ones" or "zeros" in said sequence is smaller than or equal to $T_{max}$, a set of four values for $\alpha_1$ to $\alpha_4$ is accepted. If not, the set is rejected.

If the portion of the converted packet CP' exclusive the sync word, is not allowed to have a bit pattern that equals the bit pattern of the sync word, this portion is checked for the occurrence of said bit pattern. If such bit pattern is detected, the set of four values for $\alpha_1$ to $\alpha_4$ is rejected as being inadmissible. If no such bit pattern is detected, the set is accepted.

There is another way to make sure that the serial datastream of the channel encoded output signal of the channel encoder 6 does not include a data pattern that equals the data pattern of the sync word, except for those locations where the sync words are inserted. In this case, the data pattern of the sync word is chosen to be equal to a number of "zeros" or "ones" larger than the maximum number of "zeros" or "ones" ($T_{max}$) that is allowed in the serial datastream. A channel encoding based on the requirement of $T_{max}$ and carried out on the converted packets CP (that is without the sync words) as explained above, will now take care of the fact that the converted packets CP will never have a data pattern equal to the data pattern of the sync words. This way of satisfying the requirement that the serial datastream does not include a data pattern equal to the data pattern of the sync words, except at the locations of the sync words, has the advantage that less sets of values for $\alpha_1$ to $\alpha_4$ are decided as being unacceptable. This for the reason that the channel encoding based on the $T_{max}$ requirement already results in the requirement for the sync word pattern being met.

In the case that a pilot signal should be embedded in the serial datastream of the channel encoded signal, the running digital sum value of the channel encoded signal should be determined and, for each packet to be converted, it is determined what the value for the disparity of the resulting converted packet CP (or CP') should be in order to obtain the pilot signal of relatively low frequency compared to the frequencies present in the channel encoded signal. Such a set of four values for $\alpha_1$ to $\alpha_4$ will be chosen that realizes the disparity required for the converted packet.

The search for an admissible set of four values for $\alpha_1$ to $\alpha_4$ can stop as soon as one such value has been found that satisfies all constraints posed on the channel encoded signal. This one set is denoted $\alpha_{1.def}$ to $\alpha_{4.def}$. Next, the converted packet CP (or CP') obtained using $\alpha_{1.def}$ to $\alpha_{4.def}$ is supplied to the output 7. That is: all converted words $CW_i$ obtained by carrying out the computation $$DW_i + \alpha_{1.def} FW_{1.i} + \ldots + \alpha_{4.def} FW_{4.i} = CW_i$$

result in obtaining the converted packet CP or CP', respectively. This process is repeated for subsequent packets.

In the foregoing, it is assumed that, as soon as a valid set of four values for $\alpha_1$ to $\alpha_4$ has been found, this set is chosen as the set $\alpha_{1.def}$ to $\alpha_{4.def}$. It is however also possible to determine the converted packet for all the possible sets of four values for $\alpha_1$ to $\alpha_4$. Let us assume that the various requirements result in a deletion of a number of sets of $\alpha$ values, but not all of them, so that a number of at least two sets of acceptable $\alpha$ values remain. Now that set of $\alpha$ values is chosen as $\alpha_{1.def}$ to $\alpha_{4.def}$ which satisfies the various requirements the best. Suppose we consider the requirement that the running digital sum of the serial datastream of the converted packets should result in a pilot signal of a certain frequency being embedded in the serial datastream. One can now take that set of four $\alpha$ value for which the running digital sum of the serial datastream, also within the last packet converted, gives the best approximation of the desired pattern of the pilot signal as a function of time. This means, as an example, that for each acceptable set of four $\alpha$ values, the squared difference between the actual pattern of the running digital sum within a converted packet, and the desired pattern of the running digital sum is determined, integrated over the said converted packet, and that that set of four $\alpha$ values is taken as the set $\alpha_{1.def}$ to $\alpha_{4.def}$, for which the integrated squared difference is the lowest.

It will be understood that a sufficiently large set of $\alpha$ values and sufficient values for each $\alpha$ must be available in order to derive at least one set of four values for $\alpha$ at the end of the computation carried out on a packet Q. With an 8-bit digital word for each $\alpha$, and four $\alpha$ values, this means that $255^4$ possible sets of four values are available. The more constraints that are posed on the channel encoded signal, the lower are the number n of data words in the packet Q in order that, in the end, at least one value for $\alpha$ is admissible for the channel encoding of each of the packets Q. Investigations have led to a situation where n can be 200, when all the constraints discussed above are present. The efficiency of such channel encoding is rather high: around 99.5%.

Another way of determining the values for $\alpha_{1.def}$ to $\alpha_{4.def}$ is as follows. First, a value for $\alpha_1$ is determined such that all the requirements are fulfilled for the sequence of the first A words in the packet. This value is chosen as $\alpha_{1.def}$. Next, a value for $\alpha_2$ is determined such that all requirements are fulfilled for the sequence of the next B words in the packet. This value is chosen as $\alpha_{2.def}$. Next, a value for $\alpha_3$ is determined such that all requirements are fulfilled for the sequence of C words in the packet. This value is chosen as $\alpha_{3.def}$. Next, a value for $\alpha_4$ is determined such that all requirements are fulfilled for the sequence of the last D words in the packet. This value is chosen as $\alpha_{4.def}$. The determination of the four $\alpha_{def}$ values as now described is simpler as given above. This is due to the fact that the "non-zero" words in the fixed packets are disjunct. That is: no "non-zero" word in one or more of the fixed packets coincides in position with a "non-zero" word in one of the other fixed packets. The measure of choosing disjunct positions for the "non-zero" words in the fixed packets, is thus of an advantage for the determination of the $\alpha_{def}$ values, although "non-zero" words may in general overlap.

Figure 4:
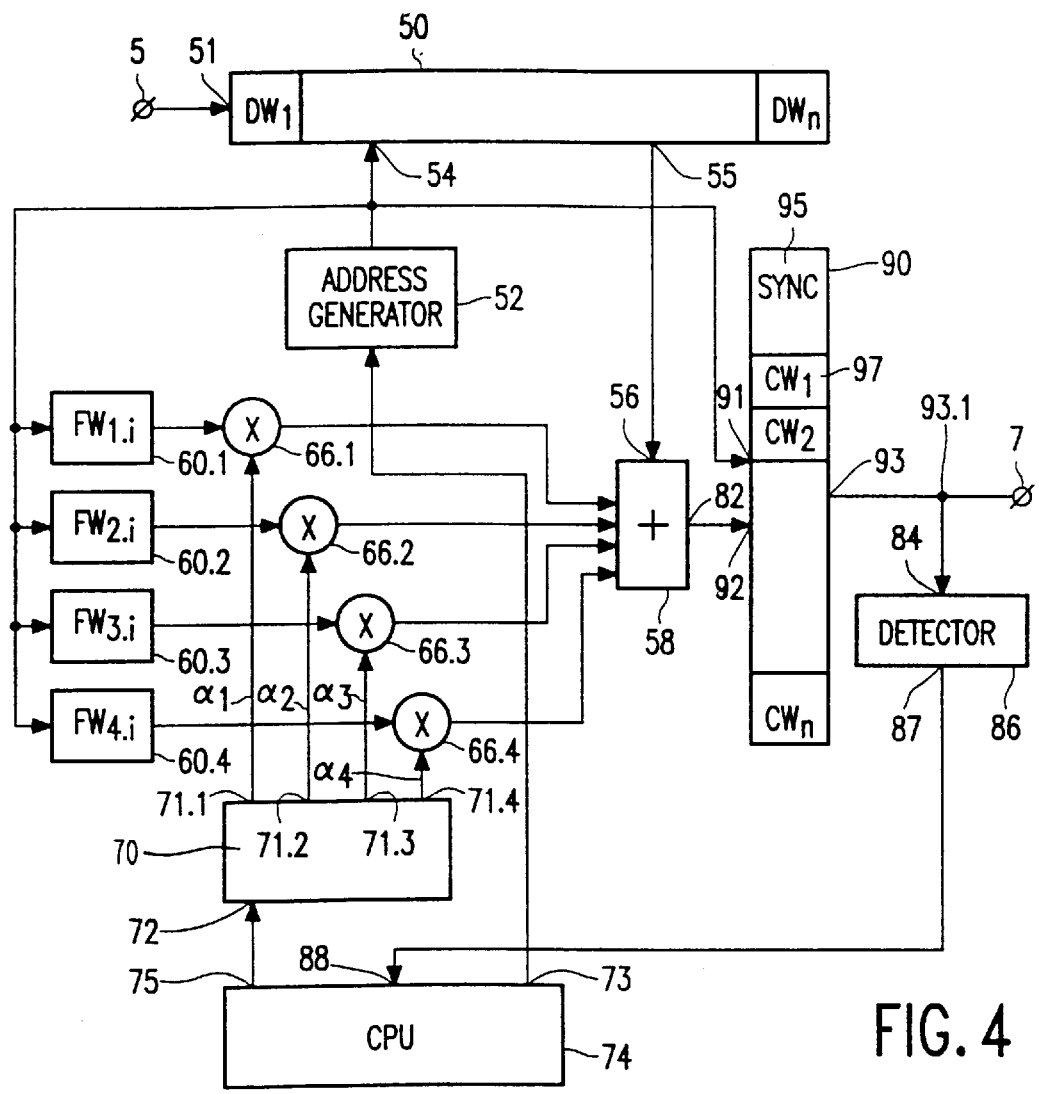
FIG. 4 shows a block diagram of an embodiment of the channel encoder unit in the recording apparatus.

FIG. 4 shows an embodiment of the channel encoder unit 6. The channel encoder unit 6 comprises a memory 50 having an input 51 coupled to the input terminal 5. A packet Q of n digital words $DW_1$ to $DW_n$ can be stored in the memory 50 under the influence of addresses supplied by an address generator 52 to an address input 54. An output 55 of the memory 50 is coupled to an input 56 of an adder unit 58. The channel encoder unit further comprises memories 60.1 to 60.4 in which the fixed packets $Q_{f.1}$ to $Q_{f.4}$ of words $FW_{1.i}$ to $FW_{4.i}$ are stored, where i runs from 1 to n. Addresses generated by the address generator 52 are also supplied to address inputs of the memories 60.1 to 60.4. Outputs of the memories 60.1 to 60.4 are coupled to first inputs of respective multipliers 66.1 to 66.4. Outputs of the multipliers 66.1 to 66.4 are coupled to respective inputs of the adder unit 58. A generator unit 70 for generating the values for $\alpha_1$ to $\alpha_4$ is available. The generator unit 70 generates the values for $\alpha_1$ to $\alpha_4$ and supplies these values to respective outputs 71.1 to 71.4 which are coupled to second inputs of the respective multipliers 66.1 to 66.4.

A memory 90 is present having a data input 92 coupled to an output 82 of the adder unit 58. The memory 90 has an address signal input 91 coupled to the output of the address generator 52. An output 93 of the memory 90 is coupled to the output 7 of the channel encoder as well as to an input 84 of a detector unit 86.

The memory 90 has stored, in a memory location indicated by 95, the bit pattern corresponding to the sync word.

A control signal is supplied to a control signal input 72 of the generator unit 70 by a central processing unit (CPU) 74 via an output 75. A control signal is supplied by the CPU 74 via an output 73 to the address generator 52, in order for the address generator 52 to supply subsequent addresses for the memories 50 and 60.1 to 60.4. The detector 86 has an output 87 which is coupled to a control input 88 of the CPU 74.

It is assumed that a packet Q has been stored in the memory 50. The procedure starts in that a control signal is generated by the CPU 74 at its output 75. Under the influence of the control signal generated at the output 75, the generator 70 generates a first set of possible values for $\alpha_1$ to $\alpha_4$ at its outputs 71.1 to 71.4, respectively. Next, an address is generated by the address generator 52 under the influence of a control signal from the CPU 74 so that the first memory locations in the memories 50 and 60.1 to 60.4 are addressed. The first digital word $DW_1$ and the first fixed words $FW_{1.1}$ to $FW_{4.1}$ of the fixed packets $Q_{f.1}$ to $Q_{f.4}$ are supplied by the memories to their respective outputs. The first fixed words $FW_{1.1}$ to $FW_{4.1}$ are supplied to the first inputs of the respective multipliers 66.1 to 66.4. A first set of values for $\alpha_1$ to $\alpha_4$ is applied by the generator 70 to the second inputs of the respective multipliers 66.1 to 66.4. At the outputs of the multipliers 66.1 to 66.4, the values $\alpha_1 \cdot FW_{1.1}$, $\alpha_2 \cdot FW_{2.1}$, $\alpha_3 \cdot FW_{4.1}$ are now available, so that the value $DW_1 + \alpha_1 \cdot FW_{1.1}$, $\alpha_2 \cdot FW_{2.1}$, $\alpha_3 \cdot FW_{4.1}$ is supplied to the output 82 of the adder unit 58. The converted codeword $CW_1$ is now applied to the input 92 of the memory 90 and stored in the next position, indicated by 97 in the memory 90.

Next, the following address is generated by the address generator 52 under the influence of a control signal from the CPU 74, so that the second memory locations in the memories 50 and 60.1 to 60.4 are addressed. The second digital word $DW_2$ and the second fixed words $FW_{1.2}$ to $FW_{4.2}$ are supplied to their outputs. For the same set of values for $\alpha_1$ to $\alpha_4$, the next converted word $CW_2$ is now obtained, presented to the input 92 of the memory 90 and stored in the next position in the memory 90.

This is repeated for all n codewords, so that in the end, the converted codeword $CW_n$ is stored in the memory 90.

Under the influence of a control signal (not shown) from the CPU 74, the contents of the memory 90 is now applied to the detector unit 86. The detector unit 86 checks whether the converted packet CP' violates one of the constraints that are posed on the channel encoded signal. If none of the constraints are violated, the detector unit 86 generates a first control signal at the output 87, this first control signal being applied to the input 88 of the CPU 74. The set of values for $\alpha_1$ to $\alpha_4$ is accepted as $\alpha_{1.def}$ to $\alpha_{4.def}$, and the converted packet stored in the memory 90 is supplied to the output 7.

If one of the constraints is violated, the detector unit 86 generates a second control signal at its output 87, this second control signal being applied to the input 88 of CPU 74. The set of values for $\alpha_1$ to $\alpha_4$ originally generated by the generator 70 is now rejected as being non-acceptable.

Upon reception of the second control signal, the CPU 74 generates a control signal at the output 75, under the influence of which the generator 70 generates the next set of four values for $\alpha_1$ to $\alpha_4$ at its outputs 71.1 to 71.4. Next converted codewords $CW_i$ are calculated using the new set of values for $\alpha_1$ to $\alpha_4$ and stored in the memory 90. Again, the detector 86 detects whether one of the constraints is violated by the newly calculated converted packet. If none of the constraints are violated, the new set of values for $\alpha_1$ to $\alpha_4$ is accepted as $\alpha_{1.def}$ to $\alpha_{4.def}$. If at least one of the constraints is violated, the new set of values is also rejected. The procedure will now be repeated again with another set of values for $\alpha_1$ to $\alpha_4$, until an acceptable set of values for $\alpha_1$ to $\alpha_4$ is found.

After having supplied the converted packet CP' to the output 7, the procedure is repeated for a new packet Q of digital words that are stored in the memory 50 so as to generate the next converted packet CP' at the output 7.

It should be noted that, if required, a 1T precoder or a 2T precoder can be inserted between the output 93 of the memory 90 and the output 7. 1T precoders and 2T precoders are well known in the art, so need no further clarification.

Figure 5:
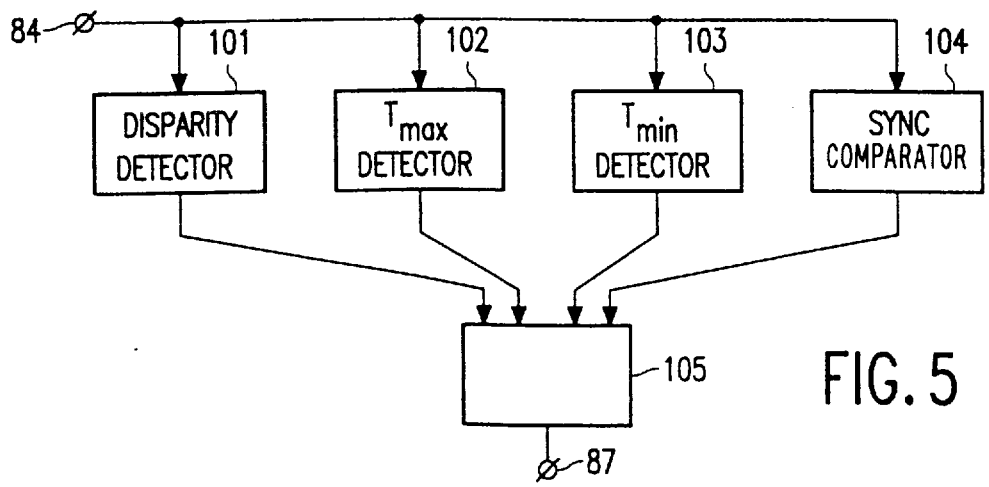
FIG. 5 shows a block diagram of an embodiment of the detector 86 of FIG. 4.

FIG. 5 shows, schematically, an embodiment of the detector 86 of FIG. 4. The detector of FIG. 5 is adapted to detect a violation of four constraints. The first constraint is that the disparity of the converted packet CP' should be zero. To that purpose, the detector comprises a disparity detector 101. The second constraint is that the serial datastream of the converted packets should obey a certain $T_{max}$. To that purpose, a $T_{max}$ detector 102 is present. The third constraint is that the serial datastream of the converted packets should obey a certain $T_{min}$. To that purpose, a $T_{min}$ detector 103 is present. Further, apart from the presence of the sync word, no bit pattern corresponding to the bit pattern of the sync word is allowed to occur in the converted packet. To that purpose, a sync comparator 104 is present for comparing the datastream of the converted packets with the syncword. The inputs of all elements 101 to 104 are coupled to the input 84 of the detector 86. Outputs of the elements 101 to 104 are coupled to corresponding inputs of a combination unit 105, which has an output coupled to the output 87 of the detector 86. Upon detecting a violation of a constraint, an element 101–104 of the detector 86 generates a "1" binary signal at its output, so that a "1" binary signal at the output 87 signifies a violation of one of the constraints.

It should be noted that, because of the linearity of the processing in the error correction encoder 3 and the channel encoder 6, the values for $\alpha_{1.def}$ to $\alpha_{4.def}$, which are included in the converted packets CP, are also error correction encoded. As a result, during reproduction, an error correction step can be carried out on the converted packets which is capable of also correcting the values $\alpha_{1.def}$ to $\alpha_{4.def}$, if they appear to be incorrect. The encoding as described above, has thus led to a datastream that is error protected, inclusive the words $\alpha_{1.def}$ to $\alpha_{4.def}$.

The reproduction in the reproducing apparatus of FIG. 1B will now be explained. Not shown in FIG. 1B, but present if a packet CP' including a sync word is received, is a sync detector 110 (see FIG. 6), which has an input 112 coupled to the output 15 of the reproducing unit 26 of FIG. 1B, for synchronizing the reproducing apparatus. Upon the detection of a sync word, a sync detection signal is supplied to an input 114 of the central processing unit (CPU) 74'. Upon receiving a sync detection signal, the CPU 74' generates a control signal (not shown) for the error correction unit 17 of FIG. 1B, so that error detection and error correction in the corrector 17 is carried out, each time, on a packet CP'. If one or more of the values for $\alpha_{1.def}$ to $\alpha_{4.def}$ appears the be incorrect, it can be corrected by the correction unit 17. In this way, the packet CP' supplied to the input 16 can be corrected so as to obtain a corrected packet CP' at the output 18.

Figure 6:
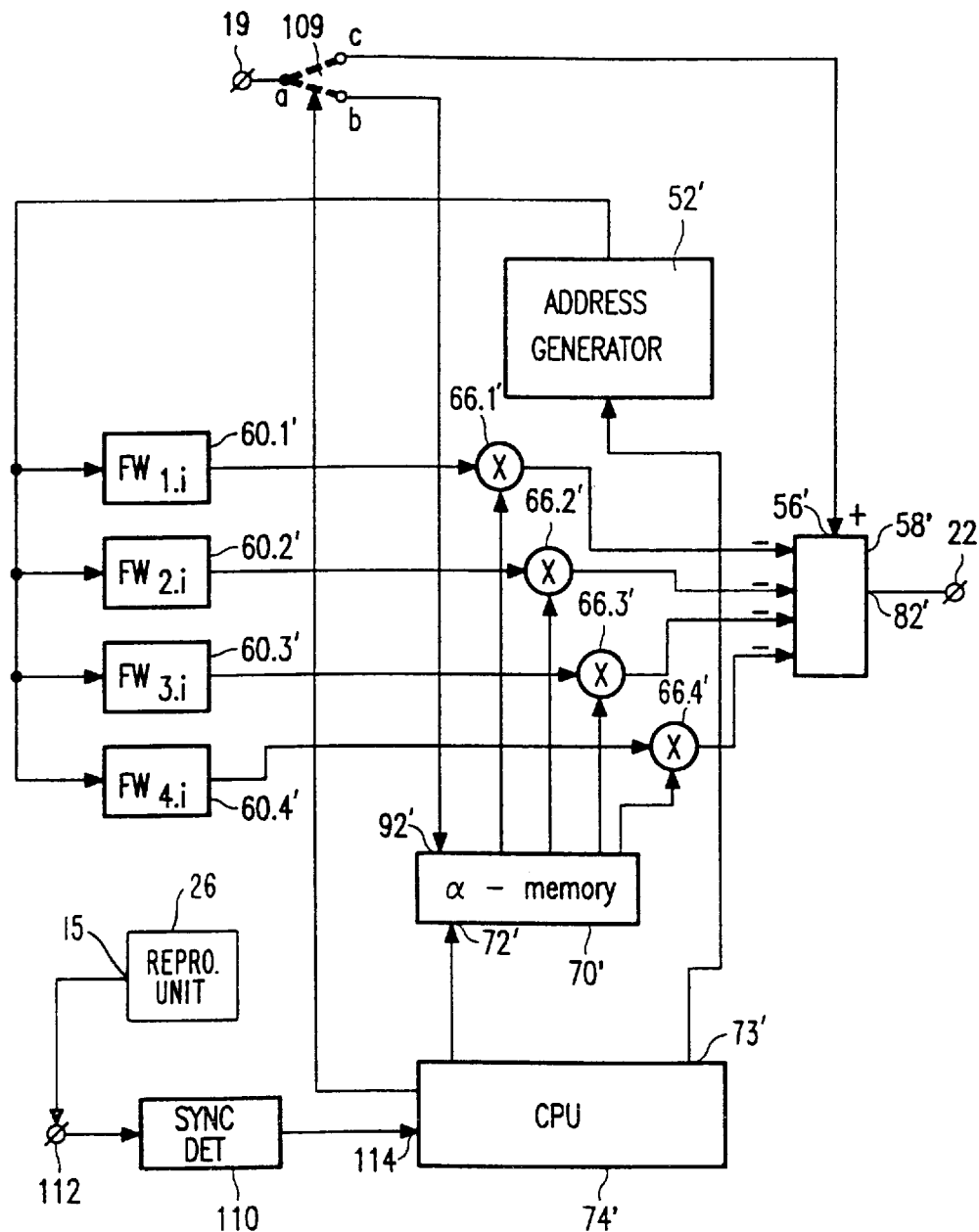
FIG. 6 shows a block diagram an embodiment of the channel decoding unit in the reproducing apparatus.

The channel decoder unit 20 shown in FIG. 1B will now be further discussed with reference to the embodiment schematically shown in FIG. 6. The channel decoder unit 20 looks a little bit like the channel encoder unit of FIG. 4, and comprises memories 60.1' to 60.4' and 70', address generator 52', multipliers 66.1' to 66.4' and a subtractor unit 58' instead of the adder 58. The memories 60.1' to 60.4' have the same n fixed data packets $Q_{f.1}$ to $Q_{f.4}$ each having words $FW_{1,i}$ to $FW_{n,i}$ stored as in the memories 60.1 to 60.4 in FIG. 4. A controllable switch 109 is present, a first terminal a of which is coupled to the input 19 of the channel decoding unit, a second terminal b of which is coupled to the input 92' of the memory 70', and a third terminal c of which is coupled to an input 56' of the subtractor unit 58'. The memory 70' is for storing at least one value for $\alpha$.

Upon receiving a corrected packet CP', the CPU 74' generates a control signal for the switch 109, so that it is set in the position a-b. The value for $\alpha_{1.def}$ can now be loaded in the memory 70' under the influence of a control signal supplied by the CPU 74' to the input 72'. Under the influence of a second control signal, the switch 109 is placed in the position a-c, so that the subsequent datawords $CW_i$, for i running from 2 to A, are supplied to the subtractor 58'. Under the influence of a control signal to the address generator 52' via the output 73' of the CPU 74', addresses are generated and supplied to the memories 60.1' to 60.4', more specifically to memory 60.1', so that the fixed datawords $FW_{1,i}$ are subsequently applied to the multiplier 66.1'.

The channel decoder unit 20 thus carries out the following calculation in the previously described Galois field GF($2^m$):

$$RW_i = CW_i - \alpha_{1.def} FW_{1,i}.$$

As a result, reconverted datawords $RW_i$, that are a replica of the original datawords $DW_i$, occur at the output 21, for i running from 2 to A.

Next, for i equals A+1, the control signal for the switch 109 controls the switch again in its position a-b, so that the value $\alpha_{2.def}$ can be retrieved from the serial datastream and stored in the memory 70'. Under the influence of a subsequent second control signal, the switch 109 is placed in the position a-c, so that the subsequent datawords $CW_i$, for i running from A+2 to A+B, are supplied to the subtractor 58'. Under the influence of a control signal to the address generator 52', addresses are generated and supplied to the memories 60.1' to 60.4', more specifically to memory 60.2', so that the fixed datawords $FW_{2,i}$ are subsequently applied to the multiplier 66.2'.

The channel decoder unit 20 thus carries out the following calculation in the previously described Galois field GF($2^m$):

$$RW_i = CW_i - \alpha_{2.def} FW_{2,i}.$$

As a result, reconverted datawords $RW_i$, that are a replica of the original datawords $DW_i$, occur at the output 21, for i running from A+2 to A+B.

Next, for i equals A+B+1, the control signal for the switch 109 controls the switch again in its position a-b, so that the value $\alpha_{3.def}$ can be retrieved from the serial datastream and stored in the memory 70'. Under the influence of a subsequent second control signal, the switch 109 is placed in the position a-c, so that the subsequent datawords $CW_i$, for i running from A+B+2 to A+B+C, are supplied to the subtractor 58'. Under the influence of a control signal to the address generator 52', addresses are generated and supplied to the memories 60.1' to 60.4', more specifically to memory 60.3', so that the fixed datawords $FW_{3,i}$ are subsequently applied to the multiplier 66.3'.

The channel decoder unit 20 thus carries out the following calculation in the previously described Galois field GF($2^m$)

$$RW_i = CW_i - \alpha_{3.def} FW_{3,i}.$$

As a result, reconverted datawords $RW_i$, that are a replica of the original datawords $DW_i$, occur at the output 21, for i running from A+B+2 to A+B+C.

Next, for i equals A+B+C+1, the control signal for the switch 109 controls the switch again in its position a-b, so that the value $\alpha_{4.def}$ can be retrieved from the serial datastream and stored in the memory 70'. Under the influence of a subsequent second control signal, the switch 109 is placed in the position a-c, so that the subsequent datawords $CW_i$, for i running from A+B+C+2 to n, are supplied to the subtractor 58'. Under the influence of a control signal to the address generator 52', addresses are generated and supplied to the memories 60.1' to 60.4', more specifically to memory 60.4', so that the fixed datawords $FW_{4,i}$ are subsequently applied to the multiplier 66.4'.

The channel decoder unit 20 thus carries out the following calculation in the previously described Galois field GF($2^m$):

$$RW_i = CW_i - \alpha_{4.def} FW_{4,i}.$$

As a result, reconverted datawords $RW_i$, that are a replica of the original datawords $DW_i$, occur at the output 21, for i running from A+B+C+2 to n.

As a result, a replica of the original datasignal as per FIG. 2a is obtained at the output 22 of the reproducing apparatus.

It should be noted that the invention has been explained with reference to an embodiment of the transmitter and receiver apparatus in the form of a recording and reproducing apparatus for recording and reproducing a digital data signal on/from a magnetic record carrier. The invention is however not restricted to this application, and is also applicable to recording/reproducing on/from optical record carriers, or applicable to transmission systems for transmitting the digital data signal via a wireless transmission channel as an example, such as in the case of a digital audio broadcast channel.

What is claimed is:

1. Transmitter apparatus, for transmitting a digital data signal via a transmission medium, the transmitter apparatus comprising:

input means for receiving the digital data signal;

error protection encoding means for carrying out an error protection encoding on the digital data signal to form an error protection encoded digital data signal;

channel encoding means for converting the error protection encoded digital data signal processed into a channel encoded digital data signal; and transmission means for applying the channel encoded digital data signal to the transmission medium, calculation means for calculating, in a Galois field GF($2^m$), a converted digital word $CW_i$ in accordance with the formula $$CW_i = DW_i + \alpha_1 \cdot FW_{1,i} + \alpha_2 \cdot FW_{2,i} + \ldots,$$

where $DW_i$ is the i-th digital word in the packet, $FW_{1,i}$, $FW_{2,i}$, ... are the i-th digital words in the at least two fixed auxiliary packets, a are coefficient multipliers to be determined, and $CW_i$ is the i-th converted digital word in the converted packet of digital words, where i is an integer value running from 1 to n.

2. Transmitter apparatus as claimed in claim 1, wherein the at least two auxiliary packets comprises a number of digital words of non-zero binary value, the positions of the non-zero digital words in an auxiliary packet not coinciding with any one of the positions of the non-zero digital words in any other auxiliary packet, the remaining digital words in an auxiliary packet having a zero binary value.

3. Transmitter apparatus as claimed in claim 2, wherein the channel encoding means further comprising digital sum value determining means for determining a digital sum value of at least a converted packet in the serial datastream of the sequence of converted packets of digital words that form the channel encoded digital data signal, the calculation means being further adapted to determine coefficient multiplier values $\alpha_{1.def}, \alpha_{2.def} \ldots$ for each packet of digital words, the channel encoding means being further adapted to convert a packet of digital words into a converted packet of digital words in accordance with the $$CW_i = DW_i + \alpha_{1.def} FW_{1,i} + \alpha_{2.def} FW_{2,i} + \ldots,$$

the coefficient multiplier values $\alpha_{1.def}, \alpha_{2.def} \ldots$ being such that a running digital sum value of the serial datastream of the converted packets shows a desired pattern as a function of time.

4. Transmitter apparatus as claimed in claim 3, wherein the channel encoding means further includes sync word generator means for generating a sync word for each of the converted packets, the channel encoding means further being adapted to combine the sync word and the converted digital words $CW_i$ obtained by the Galois field $GF(2^m)$ calculation of $$CW_i = DW_i + \alpha_{1.def} FW_i + \alpha_{2.def} FW_i \ldots,$$

so as to obtain said converted packet of digital words.

5. Transmitter apparatus as claimed in claim 4, wherein the coefficient multiplier values $\alpha_{1.def}, \alpha_{2.def}, \ldots$ are determined such that the converted packet of words is substantially DC free.

6. Transmitter apparatus as claimed in claim 5, wherein the coefficient multiplier values $\alpha_{1.def}, \alpha_{2.def}, \ldots$ are determined such that the maximum runlength in the serial datastream of the converted packets is smaller than a first value.

7. Transmitter apparatus as claimed in claim 6, wherein the coefficient multiplier values $\alpha_{1.def}, \alpha_{2.def}, \ldots$ are determined such that, except for the sync word in the converted packet, the converted packet does not comprise a bit pattern that corresponds to the bit pattern of the sync word.

8. Transmitter apparatus as claimed in claim 7, wherein the transmitter apparatus is in the form of a recording apparatus for recording the digital data signal in a track on a record carrier, the transmission means in the transmitter apparatus being in the form of recording means for recording the channel encoded digital data signal on the record carrier.

9. Receiver apparatus for receiving a digital data signal that has been transmitted as a serial datastream of converted packets via a transmission medium by means of the transmitter apparatus as claimed in claim 1, the receiver apparatus comprising:

receiving means for receiving a transmission signal from the transmission medium to form a replica of the serial datastream of converted packets at an output;

channel decoding means for converting a channel encoded signal into a channel decoded signal; and error correction decoding means for carrying out an error detection and correction on the signal applied to an input of the error correction decoding means, wherein the input of the error correction decoding means is coupled to the output of the receiving means, an output of the error correction decoding means is coupled to an input of the channel decoding means, the digital data signal being available at an output of the channel decoding means, wherein the channel decoding means is adapted to reconvert packets of digital words, each packet comprising n m-bit converted digital words, where n and m are integers larger than 1, the channel decoding means comprising:

retrieval means for retrieving at least two coefficient multiplier values $\alpha_1, \alpha_2, \ldots$ for each of the packets, from the information applied to the input of the channel decoding means;

generator means for supplying at least two fixed auxiliary packets ($FW_1, FW_2, \ldots$) also having the length of n digital words; and calculation means for calculating, in a Galois field $GF(2^m)$, reconverted words $RDW_i$ in accordance with the formula $$RDW_i = CW_i - \alpha_1 \cdot FW_{1,i} - \alpha_2 \cdot FW_{2,i} - \ldots,$$

where $CW_i$ is the i-th converted digital word in the converted packet, $FW_{1,i}, FW_{2,i}, \ldots$ being the i-th digital words in the at least two fixed auxiliary packets, $\alpha_i$ being coefficient multipliers, and $RDW_i$ is the i-th reconverted digital word in the reconverted packet of reconverted digital words, where i is an integer value running from 1 to n.

10. Receiver apparatus as claimed in claim 9, wherein the receiver apparatus is in the form of a reproducing apparatus for reproducing the digital data signal from a track on a record carrier, the receiving means in the receiver apparatus being in the form of reproducing means for reproducing the channel encoded digital data signal from the record carrier.

11. Record carrier obtained by the transmitter apparatus as claimed in claim 3, characterized in that said record carrier comprises the channel encoded data signal in a track on the record carrier, the channel encoded data signal comprising converted packets, a converted packet comprising values for the coefficient multipliers $\alpha_{1.def}, \alpha_{2.def}, \ldots$ .

12. Method for transmitting the channel encoded data signal to be carried out in the transmitter apparatus as claimed in claim 1.

13. Method for receiving the channel encoded data signal to be carried out in the receiver apparatus as claimed in claim 9.

14. Transmitter apparatus as claimed in claim 1, wherein the channel encoding means further comprising digital sum value determining means for determining a digital sum value of at least a converted packet in the serial datastream of the sequence of converted packets of digital words that form the channel encoded digital data signal, the calculation means being further adapted to determine coefficient multiplier values $\alpha_{1.def}, \alpha_{2.def} \ldots$ for each packet of digital words, the channel encoding means being further adapted to convert a packet of digital words into a converted packet of digital words in accordance with the formula $$CW_i = DW_i + \alpha_{1.def} FW_{1,i} + \alpha_{2.def} FW_{2,i} + \ldots,$$

the coefficient multiplier values a $\alpha_{1.def}, \alpha_{2.def} \ldots$ being such that a running digital sum value of the serial datastream of the converted packets shows a desired pattern as a function of time.

15. Transmitter apparatus as claimed in claim 14, wherein the channel encoding means further includes sync word generator means for generating a sync word for each of the converted packets, the channel encoding means further being adapted to combine the sync word and the converted digital words $CW_i$ obtained by the Galois field $GF(2^m)$ calculation of $$CW_i = DW_i + \alpha_{1.def} FW_i + \alpha_{2.def} FW_i \ldots,$$

so as to obtain said converted packet of digital words.

16. Transmitter apparatus as claimed in claim 15, wherein the coefficient multiplier values $\alpha_{1.def}$, $\alpha_{2.def}$, . . . are determined such that the converted packet of words is substantially DC free.

17. Transmitter apparatus as claimed in claim 16, wherein the coefficient multiplier values $\alpha_{1.def}$, $\alpha_{2.def}$, . . . are determined such that the maximum runlength in the serial datastream of the converted packets is smaller than a first value.

18. Transmitter apparatus as claimed in claim 17, wherein the coefficient multiplier values $\alpha_{1.def}$, $\alpha_{2.def}$, . . . are determined such that, except for the sync word in the converted packet, the converted packet does not comprise a bit pattern that corresponds to the bit pattern of the sync word.

19. Transmitter apparatus as claimed in claim 1, wherein the transmitter apparatus is in the form of a recording apparatus for recording the digital data signal in a track on a record carrier, the transmission means in the transmitter apparatus being in the form of recording means for recording the channel encoded digital data signal on the record carrier.

\* \* \* \* \*